United States Patent [19]

Grabbe

[11] 4,089,575
[45] May 16, 1978

[54] CONNECTOR FOR CONNECTING A CIRCUIT ELEMENT TO THE SURFACE OF A SUBSTRATE

[75] Inventor: Dimitry G. Grabbe, Lisbon Falls, Me.

[73] Assignee: AMP Incorporated, Harrisburg, Pa.

[21] Appl. No.: 727,307

[22] Filed: Sep. 27, 1976

[51] Int. Cl.² ............................................. H05K 1/12
[52] U.S. Cl. ............................ 339/17 CF; 174/52 FP
[58] Field of Search .................... 339/17 C, 17 CF; 174/52 FP; 317/101 CC

[56] References Cited

U.S. PATENT DOCUMENTS

| 3,337,678 | 8/1967 | Stelmak | 174/52 FP |
| 3,643,133 | 2/1972 | Towell | 174/52 FP |
| 3,710,299 | 1/1973 | Weisenburger | 339/17 CF |
| 3,904,262 | 9/1975 | Cutchaw | 339/17 CF |
| 3,984,166 | 10/1976 | Hutchison | 339/17 CF |

*Primary Examiner*—Neil Abrams
*Attorney, Agent, or Firm*—D. W. Phillion

[57] ABSTRACT

A two part connector system for connecting a circuit element such as an integrated circuit chip to the surface of a printed circuit board in which the first connector section, e.g., a chip carrier, which holds the circuit chip, has resilient, spring-like external terminals which can be connected directly and permanently on the printed circuit board surface, as by soldering, without appreciable risk of breakage of said connections because of different expansion and contraction coefficients of the chip carrier and the printed circuit board or, alternatively, the chip carrier can be removably mounted in the second connector section, e.g., a socket, which also has resilient, spring-like external terminals connectable permanently to the surface of the printed circuit without appreciable risk of breakage of said connections because of different expansion and contraction coefficients of the socket and the circuit board. Such a two-part connector structure enables a ceramic encapsulated circuit chip having a first coefficient of thermal expansion to be safely and advantageously mounted on a plastic printed circuit board having a substantially different coefficient of thermal expansion. Economies of space and higher frequency capabilities are obtained by the structure of the invention over that obtainable by conventional dual in-line packaging techniques.

4 Claims, 7 Drawing Figures

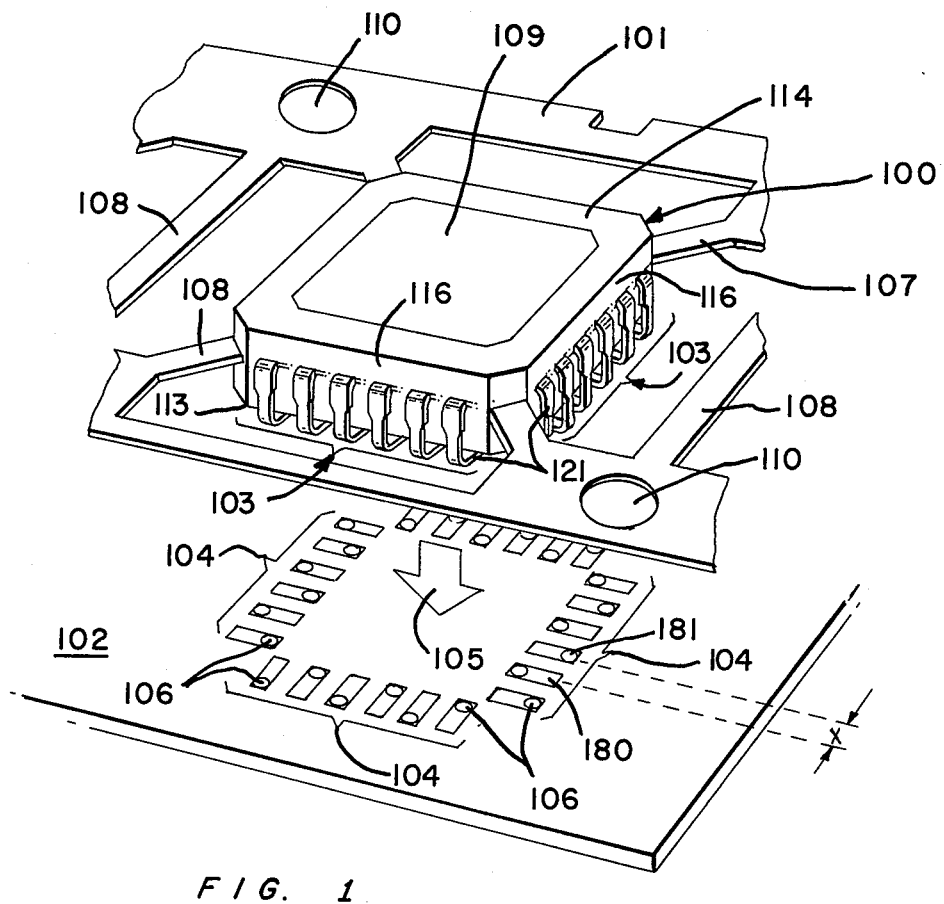
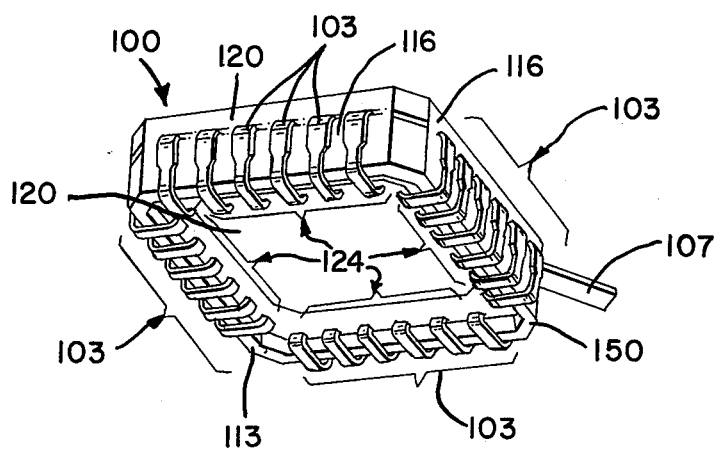
FIG. 1
FIG. 2

CONNECTOR FOR CONNECTING A CIRCUIT ELEMENT TO THE SURFACE OF A SUBSTRATE

BACKGROUND OF THE INVENTION

This invention relates generally to connectors for mounting circuit elements such as large scale integrated (LSI) chips on a substrate and more particularly to mounting LSI chips on a substrate wherein the thermal coefficient of expansion of the connector and the substrate can be different.

One of the more extensively used means for mounting integrated circuit chips on a substrate has been by means of a dual-in-line (DIP) package having a plastic housing constructed to hermetically retain the LSI chip. The LSI chip can be mounted upon first ends of a pattern of conductive leads known in the art as a spider lead assembly, the other ends of which are secured to first ends of the conductors of a lead frame structure. The lead frame conductors extend through the plastic housing and can be secured in apertures formed in a printed circuit board. Ordinarily such apertures are plated-through holes in the printed circuit board but sometimes they consist of female receptacles or sockets mounted on, or inserted in, the printed circuit board and designed to receive the terminal pins of the DIP connector.

For several reasons, including among others, the cost of manufacturing DIP receptacles, packaging space considerations, reliability of the product, and problems of inserting the fragile DIP terminals into apertures, considerable effort has been expended to develope a connector which will retain an LSI chip and which has external terminals which can be secured directly to the surface of a substrate, as by soldering, for example.

An early type of such connector employs a ceramic encapsulation, generally square in shape and multilayered, which contains an LSI chip with leads extending from the LSI chip through, and external to, the ceramic housing. Such external terminals, which are relatively rigid and configured somewhat in the nature of conductive pads, are secured to correspondingly positioned conductive pads on the surface of a ceramic mother board or hybrid substrate, as by soldering for example.

With such an arrangement, particularly in the larger chip carriers with leads of from 24 on up to 64, there is a considerable space advantage over DIP structures having an equal number of leads. More specifically, the space requirements on the substrate when the chip carriers are connected directly thereto is approximately one third that required by conventional DIP packaging structures. Further, the use of a chip carrier, as opposed to a DIP, results in a considerably reduced circuit path length because of the absence of the longer DIP terminals. As a result of the reduced circuit path lengths the lead inductance is also substantially reduced, thereby permitting operating frequencies up to three times the frequency which can be employed with a DIP package.

While a ceramic package mounted directly on the substrate has the advantages set forth above, the use of a ceramic substrate has several disadvantages. For a number of reasons, plastic printed circuit boards such as G-10 epoxy, currently are extensively employed in lieu of ceramic substrates. However, the G-10 boards have a thermal coefficient of expansion which is much greater than that of the ceramics employed in chip carriers. Accordingly, soldering of the contact pads on a ceramic chip onto the contact pads on the surface of the plastic printed circuit board would easily crack or break with any substantial change in temperature. Even the use of a plastic chip carrier having external contact pads which are soldered to contact pads on a printed circuit board having a similar temperature thermal coefficient of expansion presents certain problems.

More specifically, while the thermal coefficients of expansion of the plastic chip carrier and the printed circuit board might be similar in the X-Y coordinates, many printed circuit board designs, particularly double sided boards, have stresses produced on the opposite sides of the board due to the difference in orientation of the circuit paths provided thereon, which can produce bow in the board. Such bowing or deflection of the board in the Z axis can break the solder joints even when both the chip carrier and the circuit board are of plastic having a similar thermal coefficient of expansion.

In certain applications, it is desirable that the LSI chip carrier, or other circuit element, be removably connected to the surface of a printed circuit board. Such a removable connection can be implemented by providing a two part connector with the first part being the LSI chip carrier, which can now be either plastic or ceramic, and the second part being an interface between the first connector part and the circuit board. The second part can be permanently secured to the circuit board and the first part removably mountable in the second part. However, the permanent connection of the second part upon the circuit board presents the same problems of different thermal expansions as exist when the first part of the connector, i.e., the LSI chip carrier, is connected directly to the surface of the printed circuit board.

BRIEF STATEMENT OF THE INVENTION

It is a primary object of the invention to provide a means to secure either a plastic chip carrier or a ceramic chip carrier either directly to the surface of a printed circuit board by soldering for example, or which can be removably insertable in a socket which in turn can be either plastic or ceramic with terminals soldered to a printed circuit board without significant risk of damaging such soldered connections.

It is a further object of the invention to provide an integrated circuit chip carrier having either plastic or ceramic carrier and which has flexible external terminals solderable to contact surface areas on a printed circuit board without appreciable risk of breakage thereof due to expansion or flexure of the circuit board.

It is yet a further purpose of the invention to provide a connector assembly including a socket connector constructed to retain either a plastic or ceramic chip carrier which has flexible external leads solderable to conductive pads on the printed circuit board surface.

It is a fourth aim of the invention to replace the dual in-line (DIP) package with its long terminal leads and uneconomical use of packaging space with a relatively small, compact chip carrier which can be mounted either directly on a circuit board or alternatively can be removably mounted in a plastic or ceramic socket which in turn can be mounted on the surface of a circuit board, with no appreciable risk of damage to the solder joints because of expansion or warpage due to temperature or for other reasons.

It is still a further aim of the invention to provide a connector receptacle having resilient external leads which can be soldered or otherwise bonded to contact areas on the surface of a printed circuit board and which extend into the receptacle portion of the socket to receive and retain either a ceramic or a plastic chip carrier.

It is another object of the invention to provide either a plastic chip carrier package and/or a plastic socket package therefor in strip form and retain the packages on a strip carrier while forming the external leads which are later to be secured to a printed circuit board, thereby making possible the electrical testing of the completed plastic chip carrier while still retained in reel form.

It is a further object of the invention to provide a plastic socket for retaining either a plastic or a ceramic chip carrier and which has flexible terminals mountable on a printed circuit board surface to enable more efficient usage of the printed circuit board area in that the circuit path density leading from either a socket or a chip carrier is approximately three times that obtainable by means of a conventional DIP package.

In accordance with the invention there is provided a two part connector system with the first part known as a chip carrier comprising a plastic or ceramic housing containing therewithin a circuit element, such as an integrated circuit chip, and having terminals extending through the housing connected at one end to the terminals of the circuit chip and connected externally of the housing either directly to given conductive pads on the surface of a printed circuit board or, alternatively, removably connected to terminals in the second or socket part of the connector system. The second connector part is configured to form a receptacle for the first connector part (the chip carrier) and preferably has a plastic housing although it can be ceramic. Further, the second connector part has terminals extending through the housing to connect the external terminals of the first connector part to the same conductive pads on the printed circuit board that the external terminals of said first connector part would have been connected had said first connector part been connected directly to the surface of the printed circuit board.

Thus, it is a feature of the invention that the terminals of the socket part of the connector, and also the terminals of the chip carrier part, are arranged and configured to connect the terminals of the integrated circuit chip to predetermined conductive areas on the surface of the printed circuit board, whether the chip carrier is connected directly to the printed circuit board surface, or is seated within the socket whose terminals are in turn securely connected to the conductive areas on the surface of the circuit board.

In accordance with another feature of the invention those portions of the terminals of both the chip carrier and the socket which extend externally of the two housings are spring-like in nature with a degree of resiliency which will accommodate different rates of expansion and warpage of either of the two connector part housings or the printed circuit board without damaging the solder joints between the conductive pads on the circuit board surface and the external terminals of either connector part.

In accordance with yet another feature of the invention the terminals of the socket extend from the outside of the socket housing to the inside thereof and have an inside-the-housing collective configuration which is frictionally engageable with the external terminals of the chip carrier when inserted therein, and which also establish electrical connection from the terminals on the integrated circuit chip to the conductive areas on the printed circuit board. Thus, the chip carrier can be frictionally inserted into the socket and, then, if desired, removed therefrom and subsequently reseated or, alternatively, replaced with another chip carrier.

In accordance with other features of the invention the use of a carrier chip or a socket therefor which is soldered directly to the surface of the printed circuit board results in a substantial shortening of leads over conventional DIP packaging with a consequent ability to employ frequencies about three times as high as can be employed with DIP packages, and further to increase the circuit path density on the surface of the printed circuit board by approximately a factor of three over that which can be obtained with DIP packages. The increase in circuit path density is a result of the fact that the size of the apertures on the printed circuit board necessary to receive the leads of a DIP package are so large that the circuit path spacing which cannot be less than the center-to-center distance between the apertures in the printed circuit board, considerably greater than the circuit path spacing is possible with chip carriers or sockets whose leads do not pass through circuit board apertures, thereby permitting smaller apertures and consequent closer spacing of circuit paths.

BRIEF DESCRIPTION OF THE DRAWINGS

The above-mentioned and other objects and features of the invention will be more fully understood from the following detailed description thereof when read in conjunction with the drawings in which:

FIG. 1 is a perspective view of the first connector part, i.e., the chip carrier, shown poised above a printed circuit board upon which it is to be mounted;

FIG. 2 is a perspective view of the underside of the connector shown in FIG. 1;

DETAILED DESCRIPTION OF THE INVENTION

Figure 5:
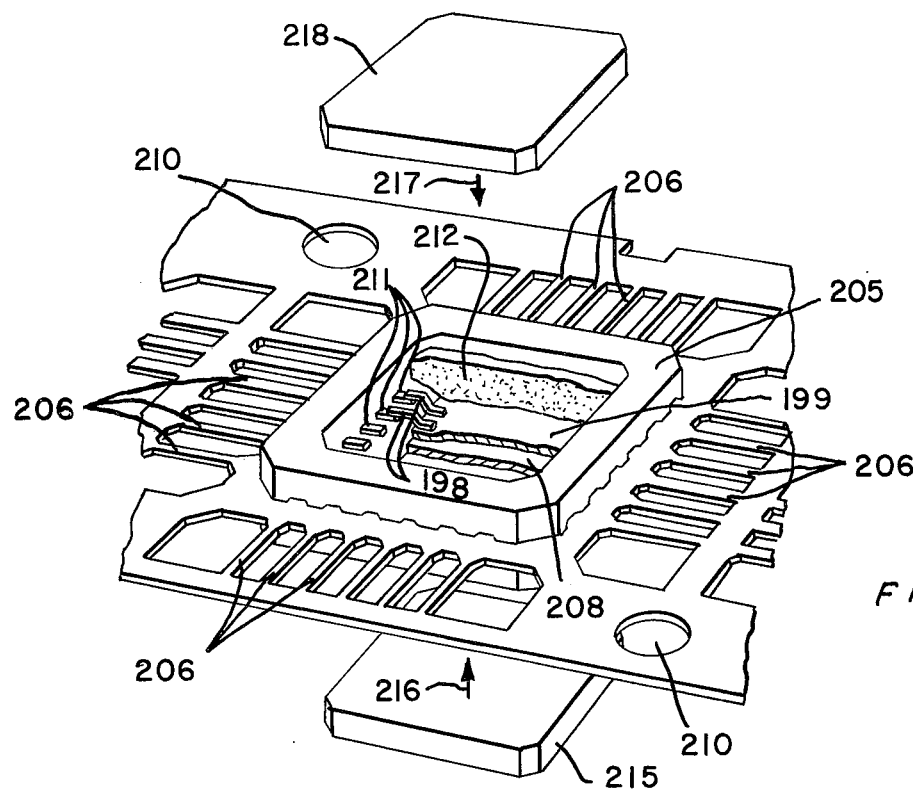
FIG. 5 is a perspective view of one form of the chip carrier, illustrating generally the fabrication thereof, with portions broken away to show the internal construction thereof including the contained circuit element, such as an integrated circuit chip, and other structural elements.

Referring to FIG. 1 the chip carrier which contains the circuit element is designated generally by reference character 100. The chip carrier 100 is of a plastic (or ceramic) frame 114 having a plurality of contact terminals 103 extending from the interior of the frame 114 to the exterior thereof. The terminals 103 are a part of the lead frame structure 101 shown in strip form. Essentially, the lead frame structure 101 is formed from a strip of metal stamped to form a strip of iterative patterns of conductors, each pattern being an assembly of terminals arranged around one or more open areas into which first ends of the terminals generally converge. The excess portions 108 of lead frame structure 101 are eventually cut off to form the final product. The holes 110 are employed in the manufacturing process to advance individual lead frame structures to a work station of assembly. The plastic frame 114 is formed around the lead frame conductors in such a manner that a portion of the lead frame conductors 103 extend into the open space defined within plastic frame 114 (portions 211 of FIG. 5). Within such open space there can be provided a spider assembly (assembly 198 of FIG. 5) upon which is mounted a circuit element, such as integrated circuit chip 199, also shown in FIG. 5.

Returning to FIG. 1 it will be observed that the portions of lead frame conductors 103 which extend out of the sides 116 of plastic frame 114 are bent downwardly and then turned under the bottom surface 113 of plastic frame 114. The turned under portions of terminals 103 are designated by reference character 121. Further, the external portions of terminals 103 are spaced a distance away from the sides 116 and the bottom 113 of plastic frame 114, so that each of the external portions of conductors 103 comprises a cantilever-type beam, the bottom portion 121 of which pivots about its junction with plastic frame 114. To further facilitate the ability of the terminals 103 to so pivot they are preferably constructed of a spring-like material.

The bent under portions 121 of terminals 103 mate with, and are bonded to, the conductive pads 104 on the surface of printed circuit board 102. Such contact pads 104 can have plated through holes 106 thereon.

The bonding of bent under portions 121 to terminal pads 104 can be done by one of several well known means, including soldering, brazing, thermo-compression or other suitable means. The particular method by which the bent under portions 121 are secured to terminals 104 is determined by various considerations such as the metals from which the terminals are formed or the materials of the connector housing and the printed circuit board. In some instances the metal interface is tin-to-tin and in other cases noble metals are employed.

All of the connections mentioned above are solid connections subject to breaking under excessive strain. However, because of the cantilever beam character of the external portions of the resilient lead frame terminals 103, relatively large movement between the connector 100 and the printed circuit board 102 can occur to absorb such excessive strain.

In FIG. 2, which shows a perspective view of the bottom of the connector 100 of FIG. 1, the turned under portions 121 of lead beam terminals 103 are more clearly shown. More particularly, the turned under ends 121 lie in a common plane and are matable with the surface of the printed circuit board 102 of FIG. 1, and more particularly are individually matable with the individual contact pads 104 formed upon the surface of circuit board 102. Element 107 is an integral part of the lead frame structure 101 and serves as a means of lifting the connector 100 out of the socket (socket 130 of FIG. 3) when used therewith, rather than being connected directly to the surface of circuit board 102.

Figure 3:
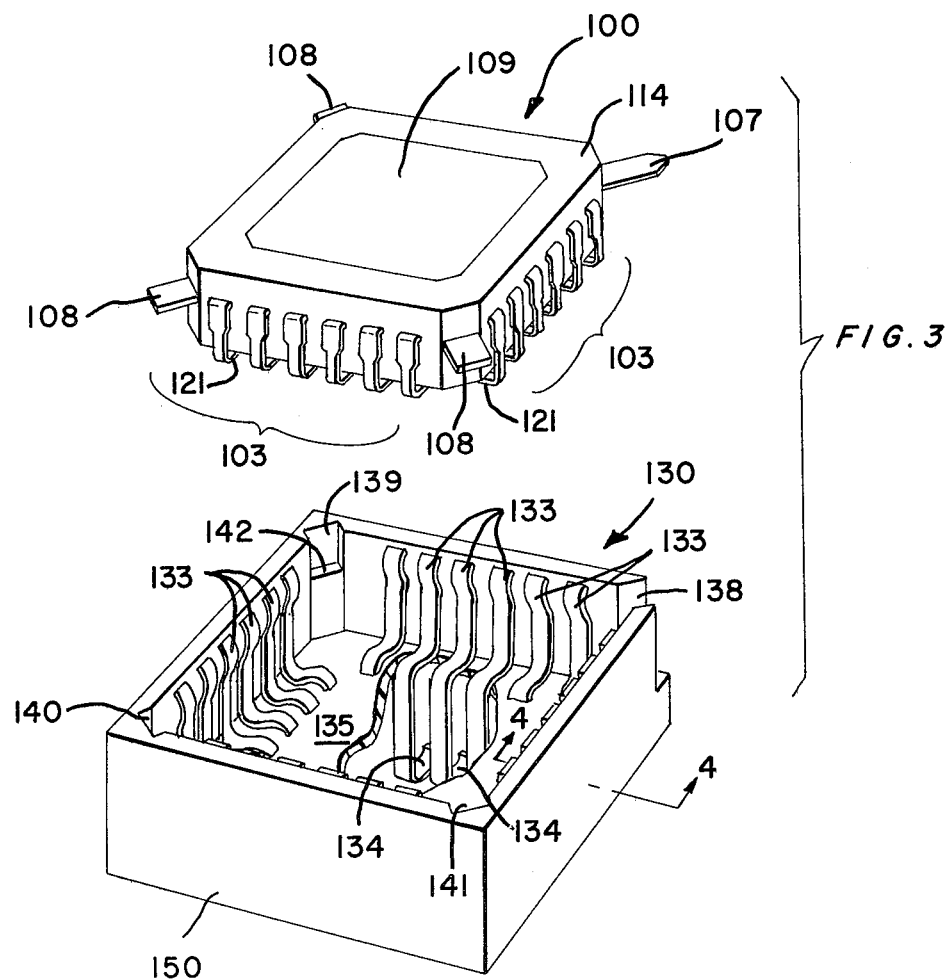
FIG. 3 is a perspective view of both the chip carrier and the socket of the invention and shows the chip carrier poised above the socket in which it is to be seated; the socket in turn to be mounted upon conductive pads on the surface of a printed circuit board (not shown)

In FIG. 3 there is shown the chip carrier 100 and the socket 130 which forms the receptacle for chip carrier 100 in the event that the chip carrier 100 is to be disconnectable. In such event socket 130 is preferably secured to the surface of a printed circuit board (board 102 of FIG. 1) in lieu of chip carrier 100, which is seated within socket 130.

The terminals 133 within socket 130 perform two functions. The first function is to connect terminals 103 of chip carrier 100 to the same conductive pads on the printed circuit board to which terminals 103 would be connected if chip carrier 100 were, in fact, connected directly to the surface of the printed circuit board. The terminals 133 also provide frictional engagement with terminals 103 of chip carrier 100 to enable chip carrier 100 to be frictionally retained in socket 130, or, if desired, to be removed from socket 130 by lifting tab 107 which is located in the corner slot 138 of socket 130. The three remaining tabs 108 of chip carrier 100 fit into the corner slots 139, 140 and 141 of socket 130. Each of the slots 139, 140 and 141 has a seating surface 142 upon which tabs 108 rest.

A portion of the bottom surface 135 of socket 130 is removed to expose the details of terminals 133. More specifically, the bent back portion 134 of terminals 133 are positioned with respect to terminal pads 104 on printed circuit board 102 (FIG. 1) in the same manner as are the bent under portions 121 of chip carrier 100. Thus, when the chip carrier 100 is inserted into socket 130 the same electrical connections are made between the circuit element contained in chip carrier 100 and the terminal pads 104 on the surface of circuit board 102 (FIG. 1) as are made when chip carrier 100 is connected directly to the surface of circuit board 102.

Figure 4:
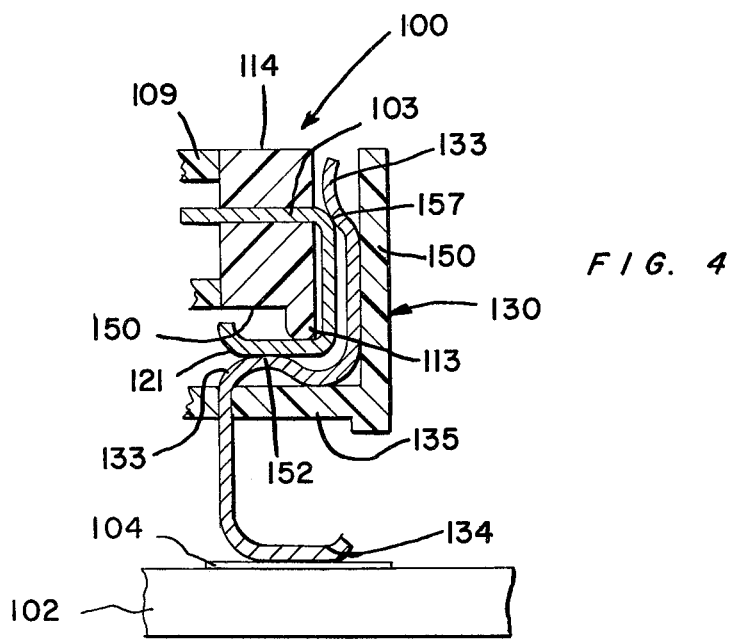
FIG. 4 is a sectional view of a portion of the structure of FIG. 3, with the two parts of the connector in a joined state; i.e., the chip carrier being seated in the socket of the two part connector system, and further shows the relationship between the terminals of the two connector parts.

FIG. 4 shows a sectional view of the structure of FIG. 3 taken through the plane 4—4 of FIG. 3, and assuming that connector part 100 has been seated within socket 130. In FIG. 4 each of the terminals 103 engages one of the terminals 133 at two points 151 and 152 at least in a spring-like manner to retain the chip carrier 100 within socket 130. The plastic frame 114 of chip carrier 100 provides the structural support for the lead frame conductors 103 extending therefrom to mate with and frictionally engage the terminals 133, which terminals are in turn supported by plastic frame 150 of receptacle 130. It can be seen in FIG. 4 that the turned under portions 134 of conductors 133 correspond in position to the turned under portions 121 of the lead frame conductors 103 and will mate with the same positions on the surface of printed circuit board 102 (FIG. 1) as would said turned under portions 121.

By the use of the chip carrier structures shown in FIGS. 1 and 2 and/or the socket of FIG. 3 it is possible to obtain closer spacing of circuit paths on the surface of a printed circuit board than can be obtained with a conventional dual in-line (DIP) package. In FIG. 1, for example, the spacing X between the center lines of adjacent conductive paths 180 and 181 is about one third the distance between adjacent conductive paths between a pair of plated through holes large enough to receive a terminal lead of a DIP package.

Figure 6:
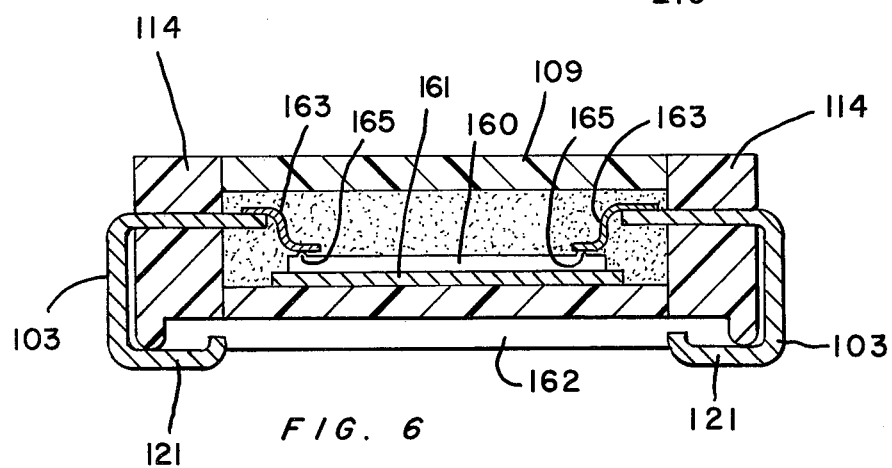
FIGS. 6 and 7 are sectional internal views of two configurations of the chip carrier of the connector assembly.
Figure 7:
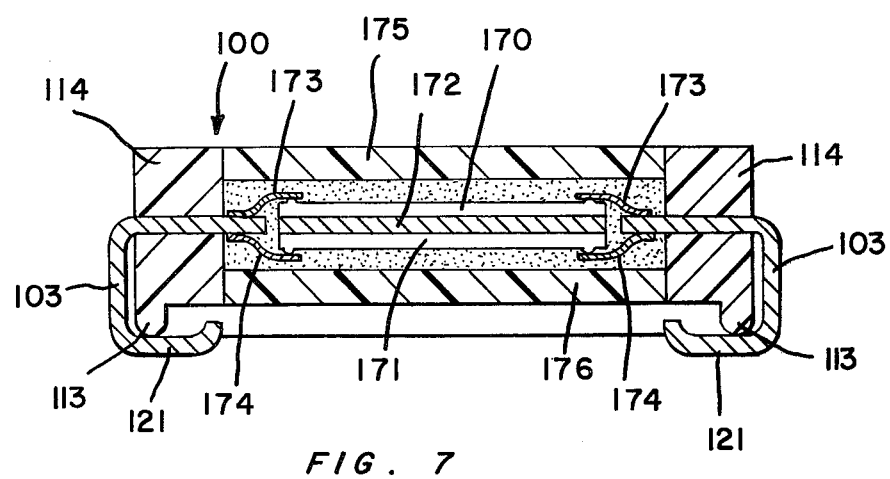

In FIGS. 6 and 7 there are shown two forms of circuit elements which can be retained within the connector part 100 of FIG. 1. While specific configurations of the structure of the circuit element within chip carrier 100 are not, per se, a part of this invention, they are relevant insofar as they illustrate typical connecting means by which the integrated circuit chips can be connected to the lead frame conductors and thence to the surface of a printed circuit board, with the necessary safeguards against damage to solder connections on the printed circuit board surface due to relative movement between the connector parts and the printed circuit board.

In FIG. 6 the integrated circuit chip 160 is secured at points 165 to resilient spider assembly leads 163 which in turn are connected to portions of lead frame terminals 103 which extend through the plastic frame 114. Further, the circuit chip 160 can be mounted upon a metal plate 161 formed from the same strip of metal from which the lead frame is formed. A conductor, not shown in FIG. 6, can extend from plate 161 to a point external to plastic frame 114 and can be connected to a suitable reference potential such as ground.

The covers 109 and 162, which enclose the space defined by plastic frame 114, can be either of plastic or metal. Alternatively, it is sometimes desirable to form cover 109 of plastic and cover 162 of metal. For example, cover 162 preferably is of metal when placed in contact with the metal plate 161 to enhance the reference ground potential connection or for cooling purposes. The bent under portions 121 of lead frame terminals 103 are soldered or otherwise mechanically and electrically secured to correspondingly positioned pads on the surface of a printed circuit board, such as conductive pads 104 of circuit board 102 of FIG. 1.

In FIG. 7 two integrated circuit chips 170 and 171 are secured to lead frame conductors 103 by separate spider assemblies 173 and 174 respectively. Further, the integrated circuit chips 170 and 171 are mounted on opposite major surfaces of flat metal plate 172 which can have a conductive lead extending therefrom to a reference potential external of plastic frame 114. The caps 175 and 176 preferably are of plastic although metal caps can be employed if desired. The bottom portions 113 of plastic frame 114 can provide some vertical support for the lead frame terminals 103, but do not restrict the flexing of said lead frame terminals 103, thereby enabling relative movement between chip carrier 100 and the printed circuit board upon which it is mounted.

It is to be understood that the forms of the invention shown and described herein are but preferred embodiments thereof and that various changes and modifications can be made therein without departing from the spirit or scope of the invention.

I claim:

1. A connector system for connecting the terminals of a circuit element to conductive areas on the surface of a substrate and comprising:

first and second connector structures;

said first connector structure comprising a first housing shaped as a receptacle and constructed to retain said second connector structure and having resilient, spring-like first terminals with portions extending from the inside of said receptacle to portions external thereof, with the external portions including sections which overlie and are conductively bonded to said conductive areas formed on the surface of said substrate;

said first housing being movable with respect to said substrate through the resiliency of the external portions of said spring-like first terminals; and said second connector structure having said circuit element retained therein and having second terminals extending from the terminals of the circuit element externally thereof and frictionally engageable with the internal portions of said first terminals of said first connector structure to make electrical contact therewith and forming means to frictionally retain said second connector structure within said first connector structure.

2. A connector system in accordance with claim 1 in which:

said first frame is selectively of plastic or ceramic;

in which said second frame is selectively of plastic or ceramic; and in which said substrate is selectively of plastic or ceramic.

3. A connector system for connecting the terminals of a circuit element to conductive areas on the surface of a substrate and comprising:

a first connector structure for retaining said circuit element and comprising a first frame and first terminals connected at one end thereof to the terminals of said circuit element and extending externally from said first frame with the externally extending portions of said first terminals being resilient; and a second connector structure;

said second connector structure comprising a box-like housing constructed to retain said first connector structure and having resilient second terminals extending internally from the inside of said box-like housing to points externally thereof and which include sections which overlie and are conductively bonded to said conductive areas on the surface of said substrate;

said box-like housing being movable with respect to said substrate through the resiliency of the external portions of said second terminals;

the external portions of said first terminals extending from said first frame being frictionally engageable with individual and predetermined ones of the internal portions of said second terminals of said second connector structure. to frictionally retain said first connector structure within said second connector structure 4. A connector system in accordance with claim 3 in which:

said first frame is selectively of plastic or ceramic;

in which said box-like housing is selectively of plastic or ceramic; and in which said substrate is selectively of plastic or ceramic.